United States Patent [19]
Beitman

[11] Patent Number: 5,656,512
[45] Date of Patent: Aug. 12, 1997

[54] METHOD OF MANUFACTURING A SEMICONDUCTOR ACCELEROMETER

[75] Inventor: Bruce Allan Beitman, Palm Bay, Fla.

[73] Assignee: Harris Corporation, Melbourne, Fla.

[21] Appl. No.: 457,643

[22] Filed: May 31, 1995

Related U.S. Application Data

[62] Division of Ser. No. 216,217, Mar. 21, 1994, Pat. No. 5,429,993, which is a continuation of Ser. No. 713,815, Jun. 12, 1991, abandoned.

[51] Int. Cl.$^6$ .................................. H01L 21/3213
[52] U.S. Cl. .................................. 438/52; 438/455
[58] Field of Search .................. 437/24, 26, 228, 437/921; 148/DIG. 12, DIG. 159; 216/11

[56] References Cited

FOREIGN PATENT DOCUMENTS

| 150532 | 2/1989 | Japan . |
| 2251142 | 10/1990 | Japan . |
| 669519 | 3/1994 | Japan . |

*Primary Examiner*—George Fourson
*Attorney, Agent, or Firm*—Charles E. Wands

[57] ABSTRACT

A semiconductor accelerometer is formed by attaching a semiconductor layer to a handle wafer by a thick oxide layer. Accelerometer geometry is patterned in the semiconductor layer, which is then used as a mask to etch out a cavity in the underlying thick oxide. The mask may include one or more apertures, so that a mass region will have corresponding apertures to the underlying oxide layer. The structure resulting from an oxide etch has the intended accelerometer geometry of a large volume mass region supported in cantilever fashion by a plurality of piezo-resistive arm regions to a surrounding, supporting portion of the semiconductor layer. Directly beneath this accelerometer geometry is a flex-accommodating cavity realized by the removal of the underlying oxide layer. The semiconductor layer remains attached to the handle wafer by means of the thick oxide layer that surrounds the accelerometer geometry, and which was adequately masked by the surrounding portion of the top semiconductor layer during the oxide etch step. In a second embodiment support arm regions are dimensioned separately from the mass region, using a plurality of buried oxide regions as semiconductor etch stops.

11 Claims, 9 Drawing Sheets

METHOD OF MANUFACTURING A SEMICONDUCTOR ACCELEROMETER

This is a division of application Ser. No. 08/216,217, filed Mar. 21, 1994 now U.S. Pat. No. 5,429,993, issued Jul. 4, 1995, which is a continuation of application Ser. No. 713,815, filed Jun. 12, 1991, now abandoned.

FIELD OF THE INVENTION

The present invention relates in general to the manufacture of semiconductor devices and is particularly directed to a process for manufacturing a cantilever-supported semiconductor accelerometer architecture.

BACKGROUND OF THE INVENTION

The fundamental components of an accelerometer device typically comprise a movable mass, one or more mass-supporting flexure elements (flexible arm regions) and a sensing mechanism which provides an (electrical) output representative of the movement of the mass (in response to a force input). In a semiconductor-resident accelerometer the sensing mechanism customarily employs the piezo-resistive properties of one or more relatively thin flexure elements, through which a larger volume, 'floating' mass region is joined to a surrounding substrate.

More particularly, as shown in FIG. 1, a typical semiconductor accelerometer structure is formed by selectively etching a semiconductor substrate 10 to define a plurality of reduced thickness arm regions 11 which extend between and adjoin a relatively thick mass region 13 and surrounding material of the substrate 10. In effect, the mass region 13 is supported in a cantilever fashion by the arm regions to the surrounding substrate. By the selective introduction of doping impurities into the arm regions and forming of electrical contacts on the doped regions, a piezo-resistive structure is formed. Because the thickness of supporting arm regions 11 is substantially reduced compared with that of mass region 13, the arms will readily flex in response to a component of force being imparted to the accelerometer structure along a line 14 orthogonal to the substrate surface. As a result of such flexing of the arm regions, there is a change in the magnitude of their piezo-resistance, so that a measurement of acceleration can be derived by output circuitry in which the change in voltage across arm regions 11 is monitored.

Now, while the structure shown in FIG. 1 represents the basic structure of a semiconductor accelerometer, it is only a diagrammatic illustration of the result of an ideal wafer processing sequence, rather than a practical one. Namely, in a practical fabrication process, the parameters of the piezo-resistive regions must be predictable and repeatable. To use a selective etch process to obtain arm regions of precise dimension places such extreme tolerances on the etch process as to render it non-cost effective for commercial production runs.

One approach to solve this precision etch requirement is to use a separate "thin" layer for the accelerometer structure, and attach the accelerometer layer to a support substrate in which a recess or cavity in the underlying substrate is provided to accommodate the flexing of the accelerometer arms and movement of the mass region. One example of such a scheme is diagrammatically illustrated in FIG. 2, which shows an underlying support substrate (or handle wafer) 20 having a selectively etched cavity 22 extending from a first surface 24 to some prescribed depth into the substrate. A top semiconductor layer 26 is bonded to support substrate 20 (e.g., means of an oxide layer 28) such that the accelerometer structure, comprised of a mass region 34 and adjoining piezo-resistive arm regions 32, is aligned (directly overlies) with a flex-accommodating cavity 22 in handle wafer 20. The thickness of top layer 26 is then reduced, (chemically or mechanically) and conductivity-modifying impurities are introduced into a pattern of arm regions 32 to form a piezo-resistive semiconductor accelerometer structure in top layer 26. Finally, the top semiconductor layer 26 is selectively etched in accordance with the intended mass/arm pattern to yield an accelerometer topography shown in FIG. 3, wherein a plurality (four, as shown in the plan view of FIG. 4) of arm regions 32 interconnect centrally located region 34 with surrounding material of top semiconductor layer 26. Because the lateral dimensions of central region 34 are greater than those of arm regions 32, region 34 has a greater mass and does not flex to the same degree as arm regions 32, so that region 34 may be considered, in effect, a 'mass' region.

Areas 35 of top semiconductor layer 26, adjacent to arm regions 32, are devoid of material as a result of the selective etch, as layer 26 is etched completely through to oxide layer 28. Thereafter, that portion of oxide layer 28 exposed by apertures 35 in top layer 28 is etched by a wet chemical etch, such as buffered HF. The etch is isotropic, so that it removes dielectric (semiconductor oxide) material underlying the relatively narrow arm regions 32, and leaves a wafer bonded accelerometer containing patterned top semiconductor layer 28 overlying flex cavity 22 in substrate 20, as shown in FIG. 4.

Now, although the fabrication techniques described with reference to FIGS. 2-4 allows the dimensions of the accelerometer structure to be precisely defined, it requires that the accelerometer-defining mask overlying bonded layer 28 be precisely aligned with respect to underlying cavity 22, thus complicating and increasing the cost of the process.

For examples of literature illustrating conventional semiconductor accelerometer architectures, such as those described above, attention may be directed to the following articles: "Tiny Accelerometer IC Reaches High Sensitivity" by Richard Nass, Electronic Design, Sep. 22, 1988, pp 170, 171; "Acoustic Accelerometers" by M. E. Motamedi, IEEE Transactions on Ultrasonics, Ferroelectrics, and Frequency Control. Vol. UFFC-34, No. 2, March 1987, pp 237–242; and "A New Uniaxial Accelerometer in Silicon Based on the Piezojunction Effect" by B. Puers et al, IEEE Transactions on Electron Devices, Vol. 35, No. 6, June 1988, pp 764–770.

SUMMARY OF THE INVENTION

Pursuant to a first embodiment of the present invention, the above-described alignment problem is successfully addressed by a process that obviates the need for 'flex-cavity' in the substrate, thereby making alignment with a precursor substrate cavity unnecessary, while still providing a cavity that underlies the semiconductor accelerometer structure, so as to accommodate translation of the mass region and flexing of its support arm regions as necessary for proper accelerometer operation. For this purpose, rather than wafer-bond a top accelerometer-containing layer that must be precisely aligned atop a cavity in the handle wafer by means of a relatively thin oxide layer, the process according to a first embodiment of the present invention attaches the top semiconductor layer to the handle wafer by means of a relatively thick insulator (oxide) layer. By relatively thick is meant a thickness sufficient to provide a separation between the top semiconductor layer and the handle wafer that is greater than the maximum operational vertical displacement of the accelerometer mass region. The process employed in accordance with a first embodiment of the present invention uses an accelerometer structure patterned in the top layer as a mask to etch out a cavity in the underlying thick oxide, which lies atop a planar handle wafer. No alignment with a handle wafer cavity is required because there is no cavity in the handle wafer.

More particularly, a monocrystalline semiconductor (e.g. silicon) layer, into which the accelerometer structure is to be formed is bonded to a thick insulator (oxide) layer that has been non-selectively formed atop a generally planar handle wafer. Unlike the above-described conventional approach, however, there is no precursor cavity in the handle wafer with which the accelerometer structure in the top layer must be aligned. Instead, the thickness of the insulator attachment layer is relatively thick. The top semiconductor layer is then thinned by a mechanical polish or chemical etch step to a desired thickness. Impurities are introduced into that portion of the thinned top layer where piezo-resistive regions are to be formed, just as in the conventional process. Next, an etch mask is selectively formed on the thinned top semiconductor layer. The topology of this etch mask is such that it defines an accelerometer geometry having a central mass region and a plurality of piezo-resistive arm regions which join the mass region to surrounding semiconductor material of the top semiconductor layer. Depending upon the lateral dimension or area of the mass region, the mask layer may include one or more apertures that project onto the mass region, so that the mass region will have corresponding apertures therethrough to the underlying oxide layer. As will be explained hereinafter, these additional apertures through the mass region facilitate etching away of the underlying insulator layer without substantially reducing the effective volume of the mass region.

Next, material of the top semiconductor layer exposed by the etch mask is etched down to the underlying thick insulator (oxide) layer. Using the pattern formed in the top semiconductor layer as a mask, the wet insulator layer etchant (e.g. hydrochloric acid in the case of silicon dioxide) is applied to the laminate structure, etching away that portion of the thick oxide exposed by the etch pattern and also oxide underlying the mass and arm regions of the accelerometer geometry. Namely, because the oxide etch is isotropic, oxide directly beneath the mass and arm regions is removed during this step. Because of the relatively narrow dimension of the arm regions, the side etch beneath the arm regions readily completely removes the oxide underlying these regions.

Depending upon the lateral area of the mass region and the thickness of the oxide layer the extent to which oxide beneath the mass region is removed may vary. To ensure complete removal of the underlying oxide, one or more apertures that have been formed in the mass region during the previous top semiconductor etch will provide the oxide etch additional access to this portion of the oxide layer. The structure resulting from the oxide etch step has the intended accelerometer geometry of a large volume mass region supported in cantilever fashion by a plurality of piezo-resistive arm regions to a surrounding, supporting portion of the semiconductor top layer. Directly beneath this accelerometer geometry is a flex-accommodating cavity realized by the removal of the underlying oxide layer. The top semiconductor layer remains attached to the handle wafer by means of the thick oxide layer that surrounds the accelerometer geometry, and which was adequately masked by the surrounding portion of the top semiconductor layer during the oxide etch step.

As a modification of the first embodiment, a first conductive layer may be formed on the top semiconductor layer and a second conductive layer may be formed on the handle wafer prior to bonding the two together by way of the thick oxide layer, thereby forming a piezoelectric structure defined by the first and second conductive layers and the large mass volume region of the cantilevered accelerometer geometry.

As described above, precise control of the parameters of the accelerometer is achieved by attaching a top semiconductor layer, the thickness of which can be relatively easily precisely tailored to within design tolerance, to a support handle by means of a relatively thick oxide layer and then etching out underlying oxide material from beneath the patterned accelerometer regions of the top semiconductor layer, leaving a flex cavity in the oxide, rather than in the wafer handle. Namely, precision control of accelerometer geometry is driven principally by the ability to precisely define the thickness of the accelerometer region resident top semiconductor layer. Because accelerometer performance is dependent upon a number of factors including mass weight (size and thickness) and piezo-resistive movement arm length and rigidity, the ability to independently establish dimensional parameters of the mass region and the support arm regions provides the accelerometer designer more flexibility in laying out an accelerometer architecture.

In accordance with a second embodiment of the invention such flexibility is afforded by a manufacturing methodology which allows the support arm regions to be dimensioned separately from the mass region, yet does so in a predictable manner, so that the process is repeatable in a top semiconductor layer that is oxide-bonded to an underlying handle wafer. For this purpose a plurality of buried oxide regions are selectively formed beneath a first surface of a semiconductor substrate which is to serve as a foundation layer for the accelerometer's support arm and mass regions. The lengths of the respective buried oxide regions effectively correspond to the lengths of the support arm regions of the accelerometer. The depths of the buried oxide regions define the 'thinness' of what is to be a cantilever support arm structure. Depending upon the implant depth of these buried oxide regions, an additional semiconductor layer may be formed to ensure the requisite mechanical strength.

For this purpose, the masking material which has been used in the formation of the buried oxide regions is removed from the surface of the semiconductor layer and an additional, epitaxial layer is grown in its place. The intended thickness of a respective support arm region of the accelerometer is thereby governed by the sum of the thickness of the epitaxial layer and the thickness of the semiconductor layer down to the buried oxide regions.

The resulting structure (with or without the additional epitaxial layer) is then inverted and attached to a handle wafer by way of a thick insulator (e.g. oxide) layer such that the thick oxide layer lies between the buried oxide-containing layer (which may include an epitaxial layer) and the handle wafer. The thickness of the (inverted) substrate is reduced to the intended final thickness of the mass region and doped with impurities to match the conductivity type of (the epitaxial layer and) the top semiconductor layer. Also, at this time, any circuit element regions that form part of accelerometer amplifier output circuitry are formed in the inverted substrate.

An etch masking layer is then selectively formed on the 'thinned' semiconductor substrate so as to define a patterned etch mask having a topology that exposes a first portion of the semiconductor substrate overlying the buried oxide regions and a second portion of the substrate spaced-apart from the first portion. The aperture in the mask that exposes the first portion of the substrate defines where the substrate will be reduced in thickness to form the arm regions. The aperture in the mask that exposes the second portion of the substrate defines where at least one through hole in the mass region will be formed to facilitate removal of the underlying oxide, as in the first embodiment of the invention, described above.

The resulting structure is then exposed to a first etchant which etches the exposed first portion of the semiconductor substrate down to the buried oxide arm regions and the exposed second portion of the substrate and the semiconductor layer therebeneath down to the thick oxide layer. Next, the structure resulting from the first etch is exposed to a second (oxide) etchant, such as HF, which etches away both the buried oxide regions and the thick oxide layer. What remains is a relatively large mass region of semiconductor material that is supported by a reduced thickness portion of the semiconductor layer and the epitaxial layer, which overlies a flex cavity provided in that portion of the thick oxide layer that has been removed by the oxide etch.

As in the first embodiment, the process according to the second embodiment may be modified so that a first conductive layer is formed on the epitaxial layer and a second conductive layer is formed on the handle wafer prior to bonding the two together by way of the thick oxide layer, thereby forming a piezoelectric structure defined by the first and second conductive layers and the cantilevered, relatively large mass region.

DETAILED DESCRIPTION

As pointed out briefly above, the first embodiment of the present invention obviates the need to align an accelerometer defining etch mask with a flex cavity in a handle wafer, by forming the mask first and then etching out underlying oxide material to form the flex cavity. A diagrammatic illustration of a semiconductor processing sequence in accordance with this first embodiment of the invention is shown in FIGS. 5–10.

Figure 1:
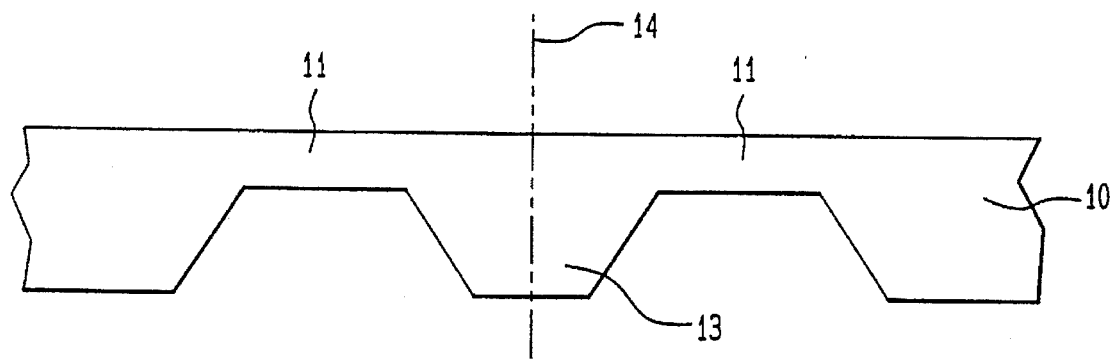
FIG. 1 shows a typical semiconductor accelerometer structure formed by selectively etching a semiconductor substrate to define a plurality of reduced thickness arm regions which extend between and adjoin a relatively thick mass region and surrounding material of the substrate.
Figure 2:
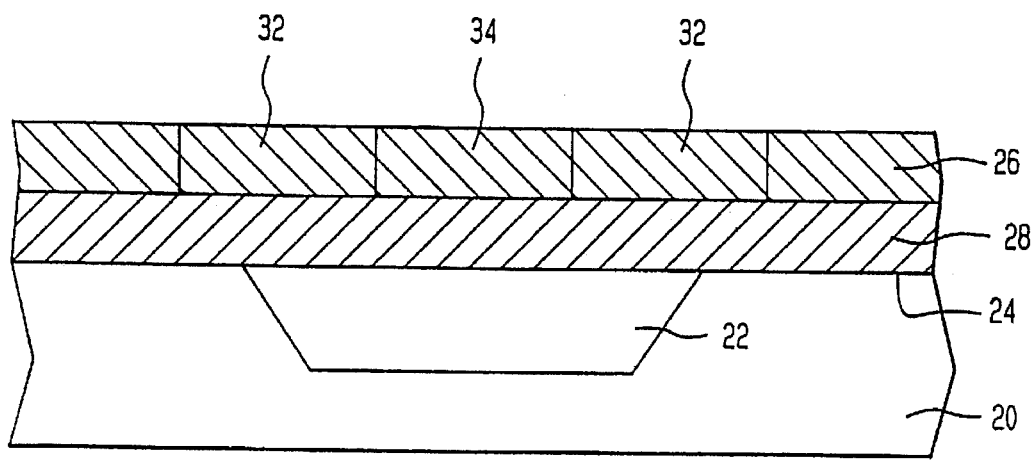
FIG. 2 shows a handle wafer having a selectively etched flex-accommodating cavity extending from a first surface to some prescribed depth into the wafer.
Figure 3:
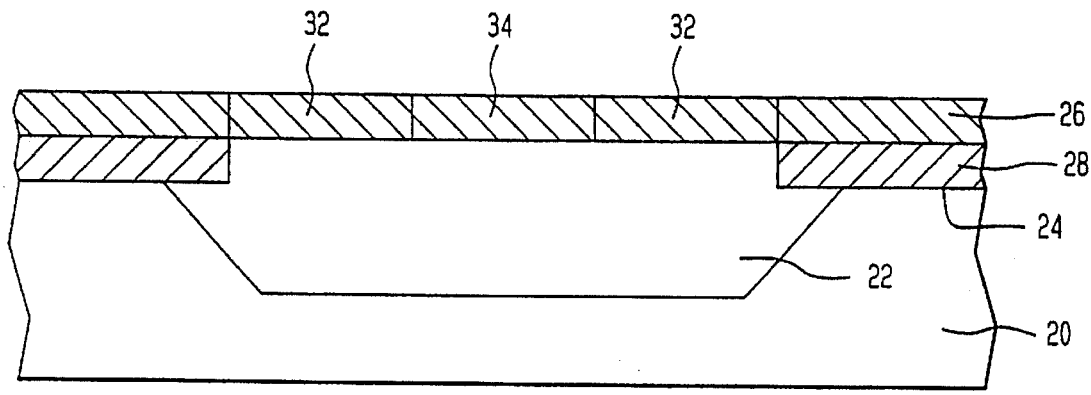
FIG. 3 shows a semiconductor accelerometer topology, wherein a plurality of arm regions interconnect a centrally located mass region with surrounding material of a semiconductor layer.
Figure 4:
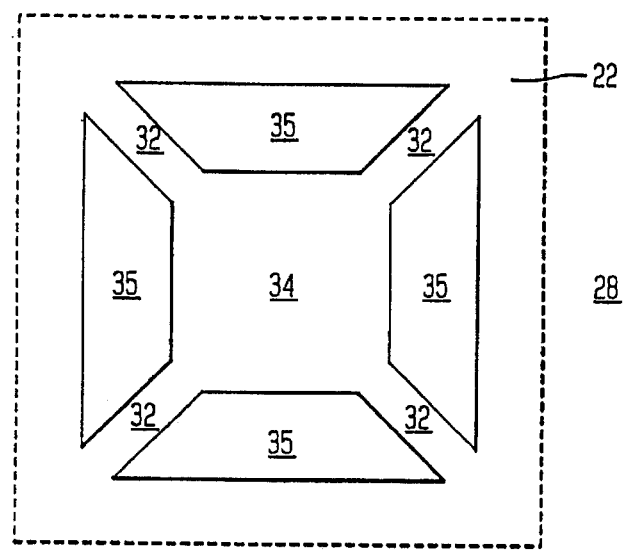
FIG. 4 shows the result of performing an isotropic etch to remove semiconductor material underlying relatively narrow arm regions to leave a wafer bonded accelerometer containing a patterned top semiconductor layer overlying a flex cavity in an underlying substrate.
Figure 5:
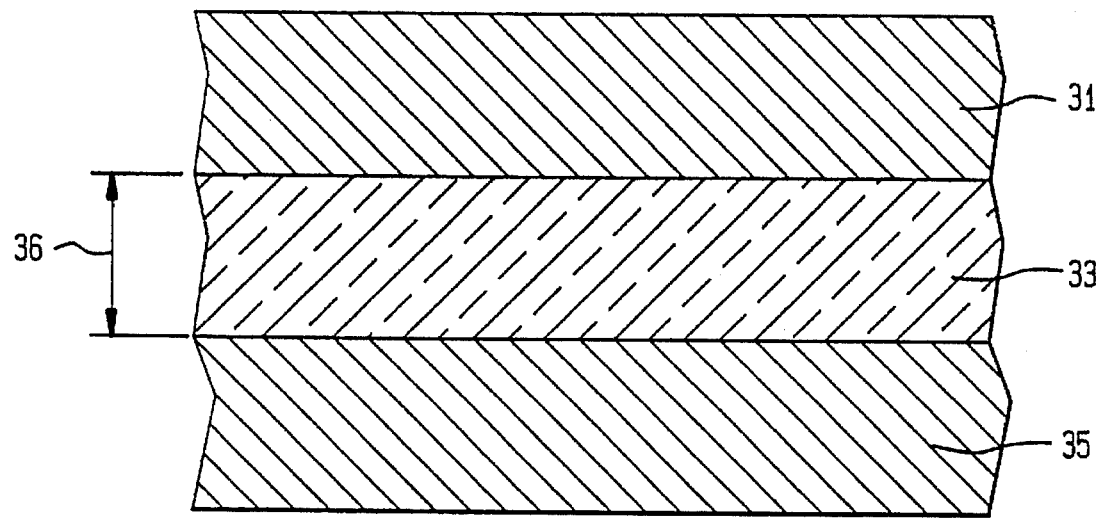
FIGS. 5–10 diagrammatically show a semiconductor accelerometer processing sequence in accordance with a first embodiment of the invention.

More particularly, as shown in FIG. 5, a monocrystalline semiconductor (e.g. silicon) layer 31 into which the accelerometer structure is to be formed is bonded to a thick insulator (oxide) layer 33 that has been non-selectively formed atop a generally planar handle wafer 35. Unlike the above-described conventional approach, however, there is no precursor cavity in handle wafer 35 with which the accelerometer structure in top layer 31 must be aligned. Instead, the thickness of insulator attachment layer 33 is relatively thick. As noted earlier, by relatively thick is meant a thickness sufficient to provide a separation 36 between top semiconductor layer 31 and handle wafer 35 that is greater than the maximum operational vertical displacement of the accelerometer mass region.

Figure 6:
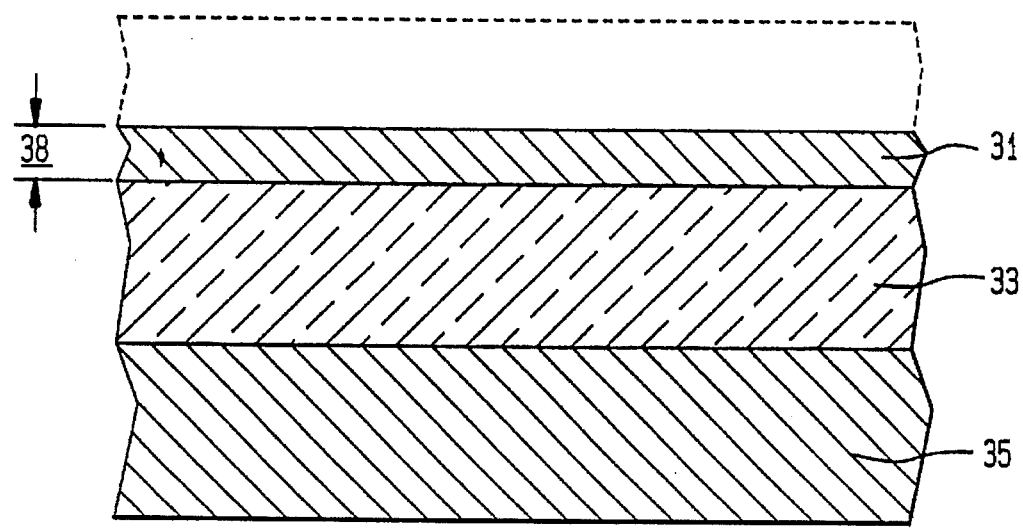
Figure 7:
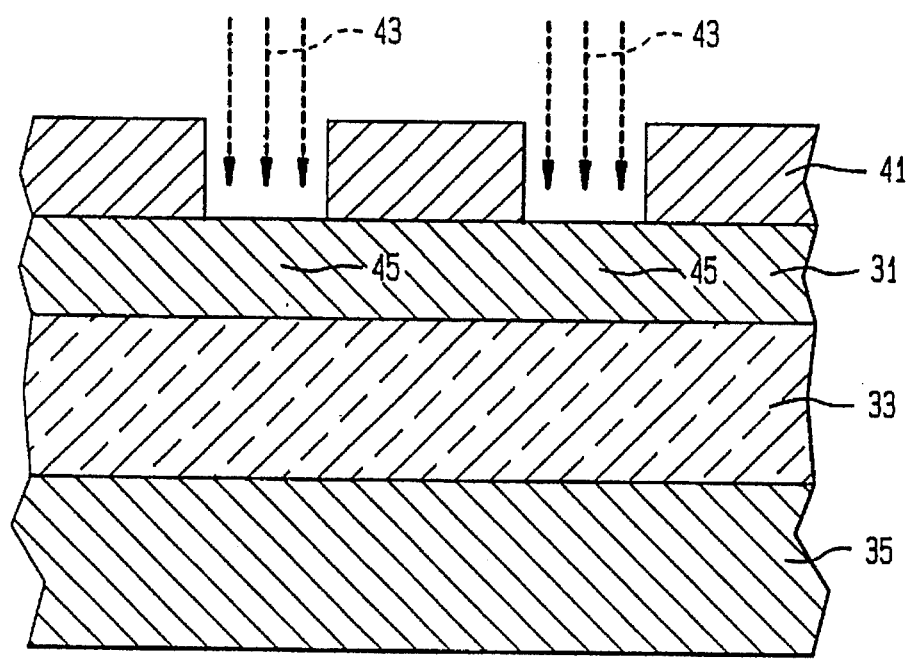

Next, as shown in FIG. 6, top semiconductor layer 31 is then thinned by a mechanical polish or chemical etch step to a desired thickness 38. Top semiconductor layer 31 is then masked, as shown at 41 in FIG. 7 and impurities 43 are introduced at into those portions 45 of the thinned top layer 31 where piezo-resistive regions are to be formed.

Figure 8:
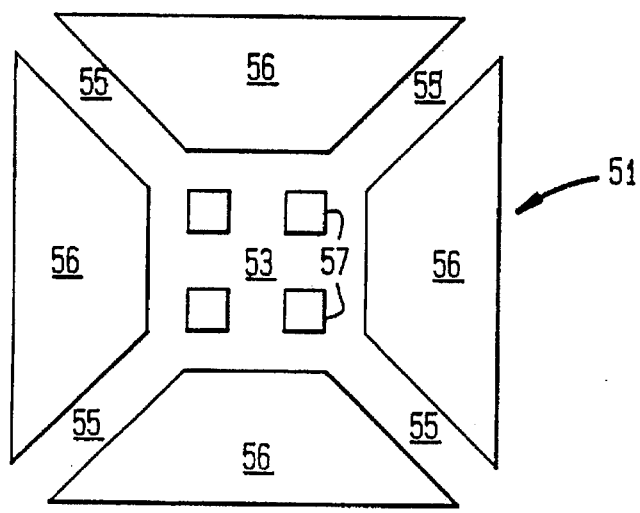

Next, mask 41 is stripped off top layer 31 and an etch mask 51, patterned as shown in FIG. 8, is selectively formed on the thinned top semiconductor layer 31. The topology of etch mask 51 is such that it defines an accelerometer geometry having a central mass region 53 and a plurality of doped, piezo-resistive arm regions 55, defined by apertures 56, arm regions 55 joining mass region 53 to surrounding semiconductor material of the top semiconductor layer 31. Depending upon the lateral dimension or area of central mass region 53, mask 51 may include one or more apertures 57 that project onto mass region 53, so that mass region 53 will have corresponding apertures therethrough to underlying oxide layer 35. These additional apertures 57 facilitate etching away of the underlying insulator layer without substantially reducing the effective volume of mass region 53.

Figure 9:
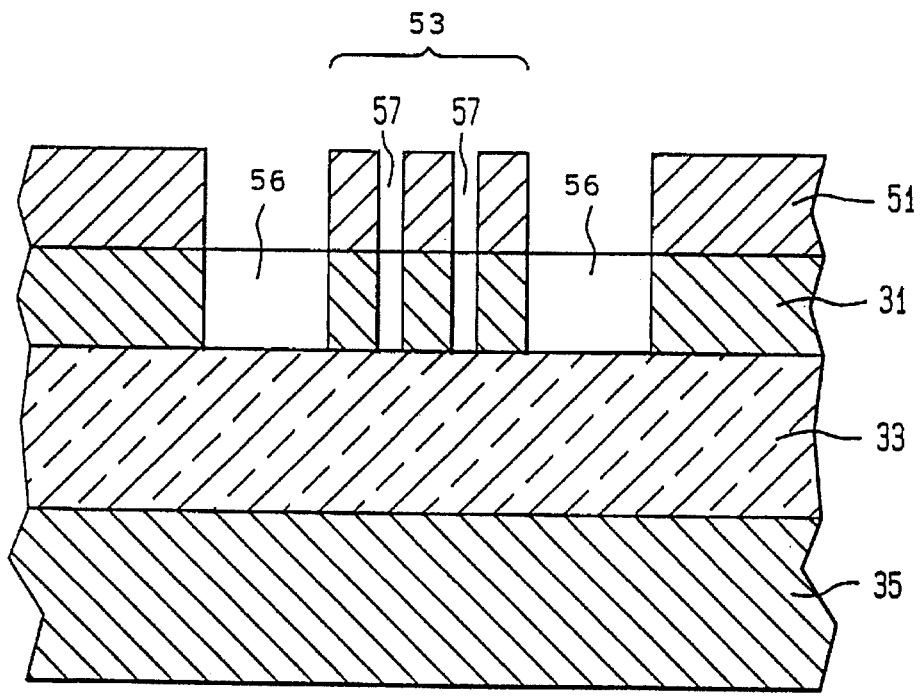
Figure 10:
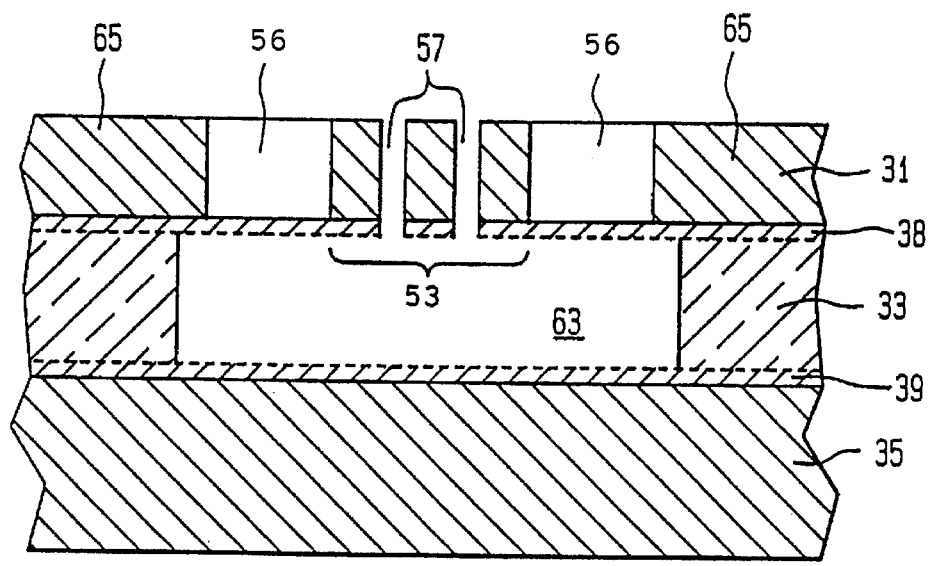

Next, as shown in FIG. 9, material of top semiconductor layer 31 exposed by etch mask 51 is etched down to the underlying thick insulator (oxide) layer 35. Silicon etch mask 51 is then removed and, using the resulting aperture pattern formed in top semiconductor layer 31 as a masking pattern, a wet insulator layer etchant (e.g. hydrochloric acid in the case of silicon dioxide) is applied to the laminate structure, etching away that portion of the thick oxide exposed by the etch pattern and also oxide underlying the mass and arm regions of the accelerometer geometry, as shown in FIG. 10. Namely, because the oxide etch is isotropic, that portion of thick oxide layer 33 directly beneath mass region 53 and arm regions 55 is removed. Because of the relatively narrow dimension of the arm regions, the side etch beneath the arm regions readily completely removes the oxide underlying these regions, so as to leave a flex-cavity 63 in thick oxide layer 33 underlying mass region 53 and arm regions 55.

Depending upon the lateral area of mass region 53 and the thickness of the oxide layer 33 the extent to which oxide layer 33 beneath mass region 53 is removed may vary. The number and size of apertures 57 in top layer 31 is chosen to ensure complete removal of the underlying oxide, during the oxide wash step. The structure of FIG. 10, resulting from the oxide etch step, has the intended accelerometer geometry of a larger volume mass region 55 supported in cantilever fashion by a plurality of piezo-resistive arm regions 55 to a surrounding, supporting portion 65 of the semiconductor top layer, while directly beneath this accelerometer geometry is a flex-accommodating cavity 63 realized by the removal of the underlying oxide layer. Although the isotropy of the oxide etch produces a slight undercut of top semiconductor layer 31, layer 31 remains attached to the handle wafer 35 by means of that portion 65 of the thick oxide layer 33 which surrounds the accelerometer geometry and which was masked by the surrounding portion of the top semiconductor layer during the oxide etch step.

FIG. 10 further shows, in broken lines, a modification of the above described first embodiment of the invention, in which a first conductive layer 38 may be formed on top semiconductor layer 31 and a second conductive layer 39 may be formed on handle wafer 35 prior to bonding the two together by means of thick oxide layer 33, thereby forming a piezoelectric structure defined by the first and second conductive layers 38, 39 and the relatively large mass region 53, supported in cantilever fashion by arm regions 55. During the etch process, first conductive layer 38 is sufficiently thin, so that it is readily punched through at the etch apertures to permit etching out of cavity 63.

As described above, precise control of the parameters of the accelerometer is achieved by patterning top semiconductor layer 31, the thickness of which can be relatively easily precisely tailored to within design parameters, top layer 31 being bonded to support handle 35 by means of relatively thick oxide layer 33, and then etching out underlying oxide material from beneath the patterned accelerometer regions of the top semiconductor layer, leaving a flex cavity in the oxide, rather than in the wafer handle. Thus, precision control of accelerometer geometry is driven principally by the ability to precisely define the thickness of the accelerometer region resident top semiconductor layer 31.

As stated previously, accelerometer performance is dependent upon a number of factors, including mass weight (size and thickness) and piezo-resistive movement arm length and rigidity. Thus, the ability to independently establish dimensional parameters of the mass region and the support arm regions provides the accelerometer designer more flexibility in laying out an accelerometer architecture. In accordance with a second embodiment of the invention, a processing sequence for which is diagrammatically illustrated in FIGS. 11-19, such flexibility is afforded by a manufacturing methodology which allows the support arm regions to be dimensioned separately from the mass region, yet does so in a predictable manner, so that the process is repeatable in a top semiconductor layer that is oxide-bonded to an underlying handle wafer.

Figure 11:
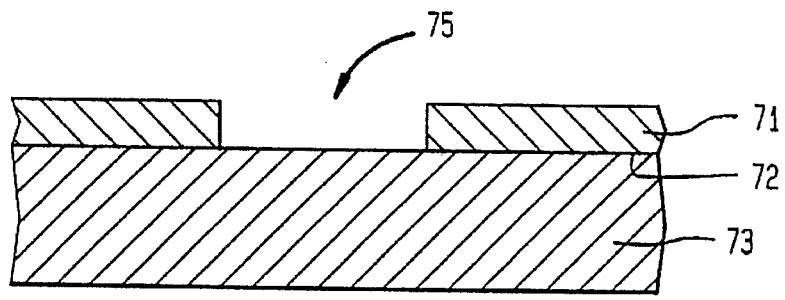
FIG. 11–19 diagrammatically show a semiconductor accelerometer processing sequence in accordance with a second embodiment of the invention.
Figure 12:
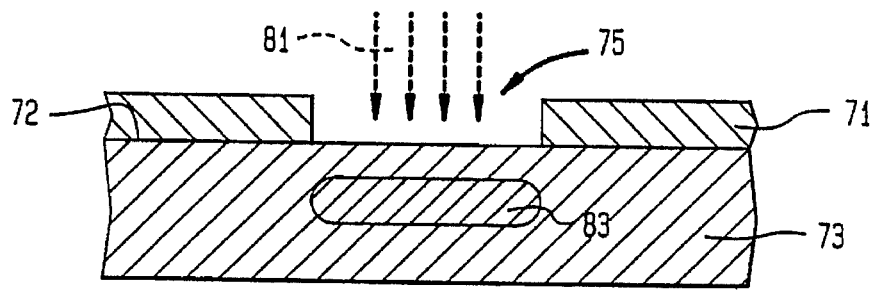

More specifically, as shown in FIG. 11, starting with an initial structure of a masking layer 71 (e.g. oxide) atop a first surface 72 of a semiconductor (e.g. silicon) substrate 73, which is to serve as a foundation layer for the accelerometer's support arm and mass regions. Masking layer 71 is patterned (e.g. at 75) to defined the geometry of a plurality of arm regions of the accelerometer architecture. Then, as shown in FIG. 12, oxide 81 is implanted and the structure is annealed to form a plurality of buried oxide regions 83 beneath surface 72 of substrate. The lengths of the respective buried oxide regions 83 effectively correspond to the lengths of the support arm regions of the accelerometer, while the depths into the substrate of the buried oxide regions 83 define the 'thinness' of what is to be a cantilever support arm structure. Depending upon the implant depth of these buried oxide regions, an additional semiconductor layer may be formed to ensure the requisite mechanical strength. In the present description, such an additional semiconductor layer for increased mechanical rigidity will be used.

Figure 13:
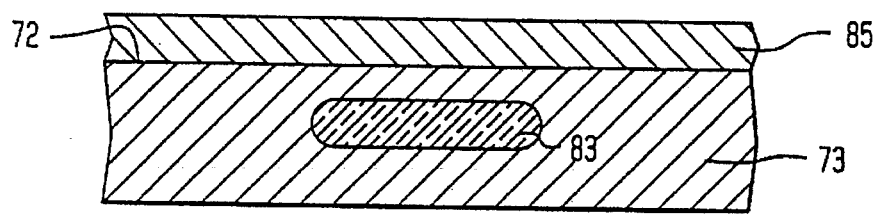
Figure 14:
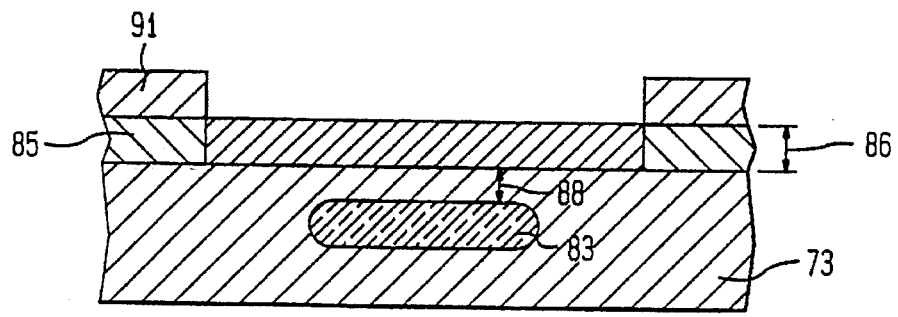

For this purpose, as illustrated in FIG. 13, masking layer 71 is removed from surface 72 of semiconductor layer 73 and an epitaxial semiconductor layer 85 is grown in its place, as shown in FIG. 14. The intended thickness of a respective support arm region of the accelerometer is thereby governed by the sum of the thickness of epitaxial layer 85 and the thickness of semiconductor substrate 73 down to the buried oxide regions. A layer of photoresist 91 is selectively formed atop epitaxial layer 85 to mask that portion of the epitaxial layer 91 where accelerometer regions are to be formed, and epitaxial layer 85 is doped with impurities of a conductivity type opposite to that of substrate 73.

Figure 15:
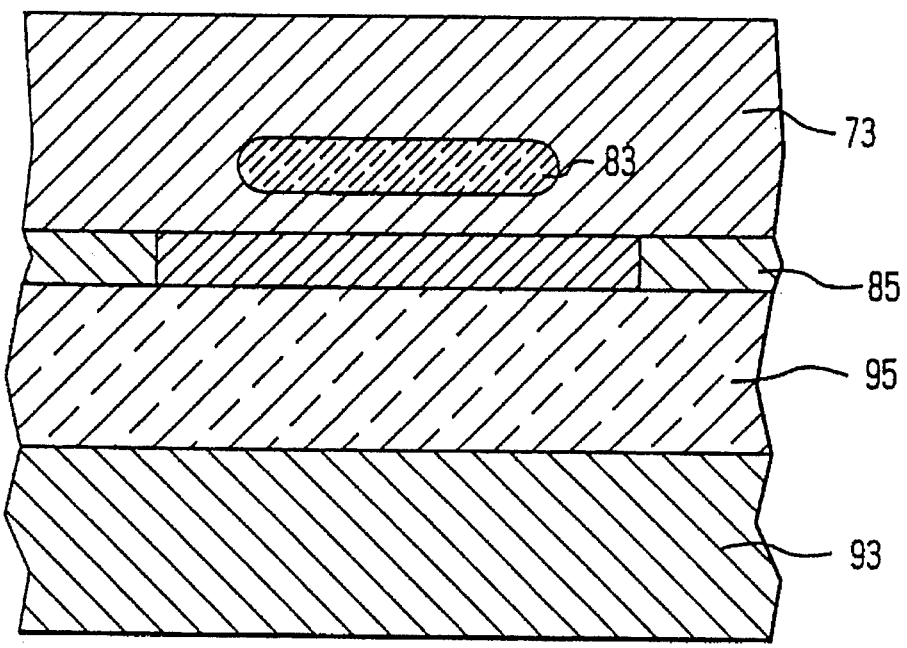
Figure 16:
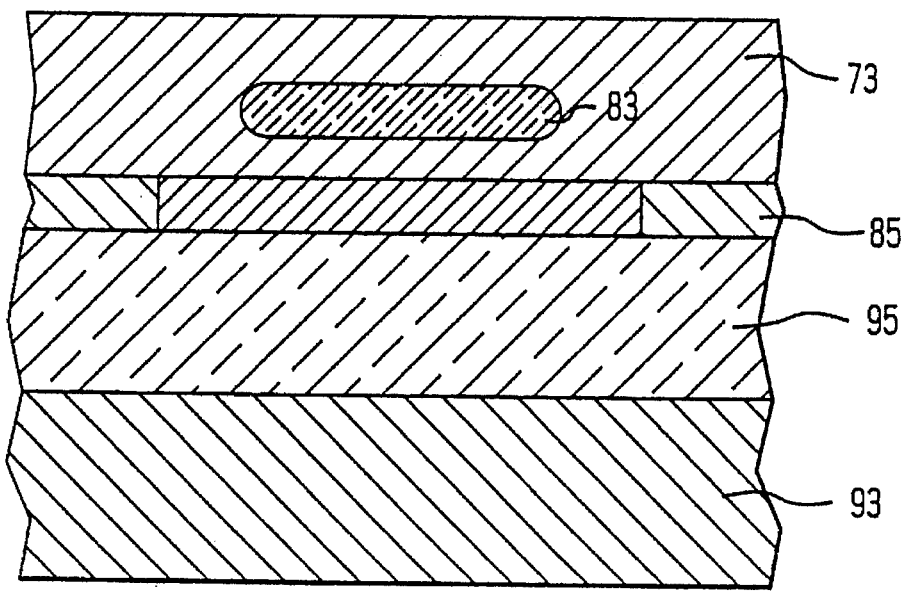

Next, as shown in FIG. 15, photoresist layer 91 is removed and the resulting structure is inverted and attached to a semiconductor (silicon) handle wafer 93 by way of a thick insulator (e.g. oxide) layer 95, such that thick oxide layer 95 joins epitaxial layer 85 to handle wafer 93. In FIG. 16, the thickness of (inverted) substrate 73 is reduced to the intended final thickness of the mass region and doped with impurities to match the conductivity type of the epitaxial layer and the top semiconductor layer. During this doping step, circuit element regions that form part of accelerometer amplifier output circuitry are formed in the inverted substrate.

Figure 17:
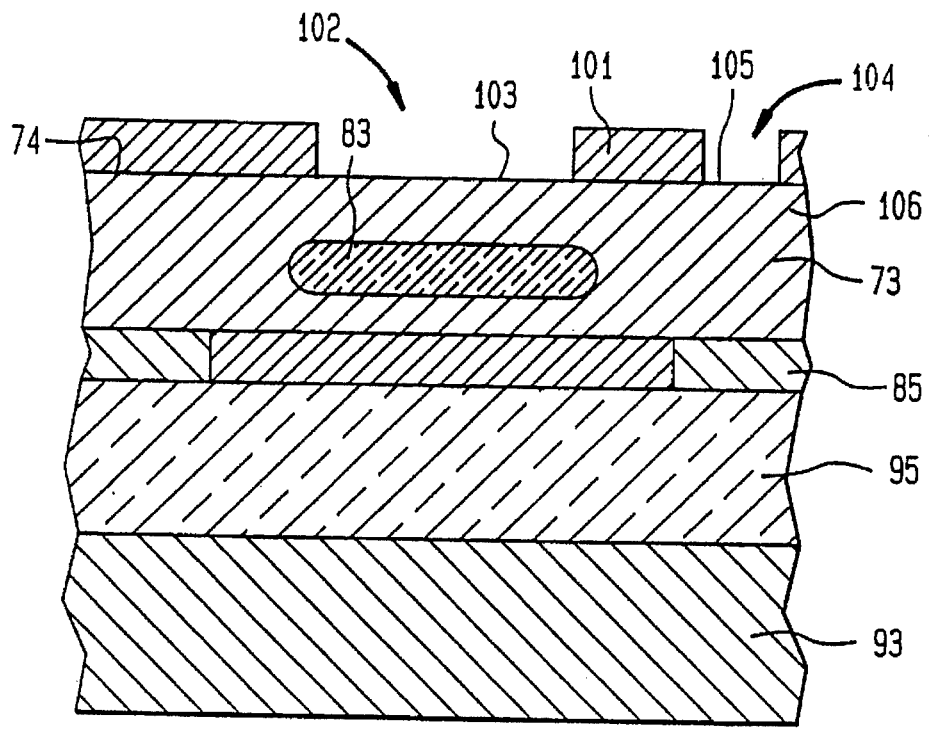

As shown in FIG. 17, a silicon etch masking layer 101 is then selectively formed on a second surface 74 of the inverted, thinned and doped semiconductor substrate 73, so as to define a patterned etch mask having a topology that exposes first portions 103 of substrate 73 overlying buried oxide regions 83 and a second portion 105 of substrate 73 spaced-apart from the first portion. An aperture 102 in mask layer 101 that exposes first portion 103 of substrate 73 defines where the substrate will be reduced in thickness to form arm regions of the accelerometer. An aperture or apertures 104 in mask layer 101 that exposes the second portion 103 of the substrate defines where one or more through holes in an accelerometer mass region will be formed, to facilitate removal of the underlying oxide, as in the first embodiment of the invention. That portion 106 of the substrate underlying masking layer 101 centrally located of arm regions 85 corresponds to the mass region. The masked structure of FIG. 17 is then exposed to a first, silicon etchant which etches the exposed first portion 103 of substrate 73 down to buried oxide arm regions 83 and the exposed second portion or portions 105 of the substrate and the epitaxial layer 85 therebeneath down to thick oxide layer 95, as shown in FIG. 18.

Figure 18:
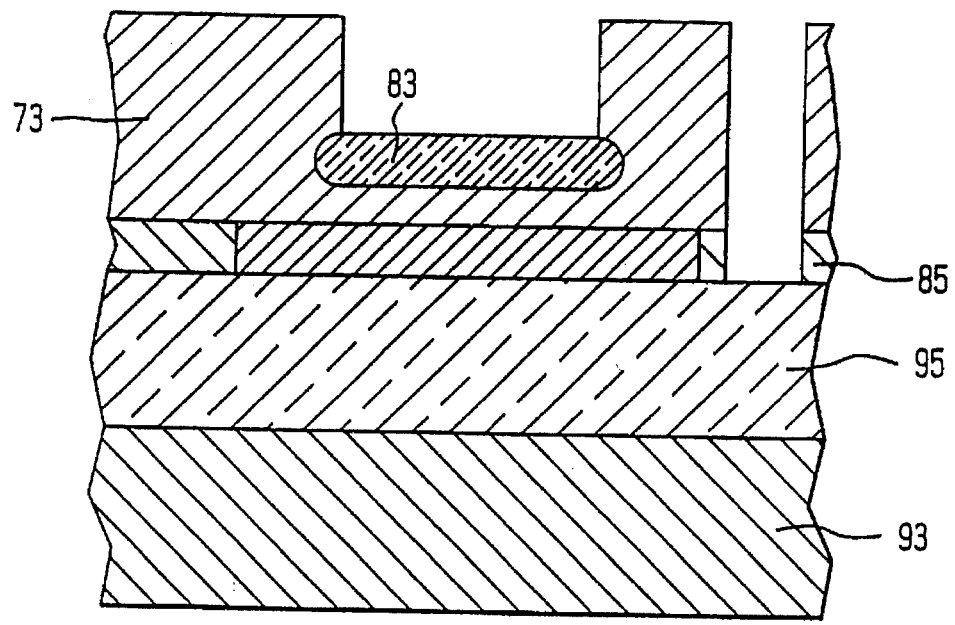
Figure 19:
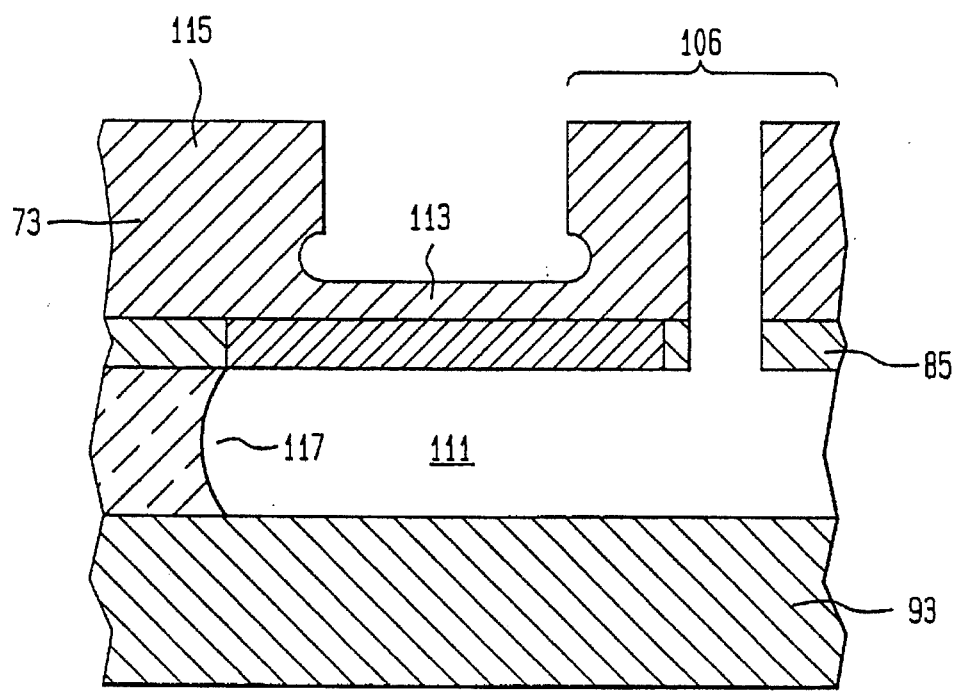

Next, as shown in FIG. 19, the structure of FIG. 18 resulting from the silicon etch is exposed to a second (oxide) etchant, such as HF, which etches away both buried oxide regions 83 and thick oxide layer 95. What remains is a relatively large mass region of semiconductor material 106 that is supported by reduced thickness arm regions formed of semiconductor substrate 73 and epitaxial layer 85, which overlies a flex cavity 111 provided in that portion of the thick oxide layer 95 that has been removed by the oxide etch. As in the first embodiment, depending upon the size of mass region 106 and the thickness of oxide layer 95, the extent to which oxide layer 95 beneath mass region 106 is removed during the oxide etch step may vary. The number and size of apertures 104 in masking layer 101 is chosen to ensure complete removal of the underlying oxide, during the oxide etch step. The structure of FIG. 19 has the intended accelerometer geometry of a relatively large volume mass region 106 supported in cantilever fashion by a plurality of piezo-resistive arm regions 113 to a surrounding, supporting portion 115 of the semiconductor substrate 73 and adjoining epitaxial layer 85. Directly beneath this accelerometer geometry is a flex-accommodating cavity 111 realized by the removal of the underlying oxide layer. Again, as in the first embodiment, although the isotropy of the oxide etch produces a slight undercut 116 of epitaxial layer 85, the semiconductor support laminate remains attached to handle wafer 93 by means of that portion 121 of the thick oxide layer 95 which surrounds the accelerometer geometry and which was masked by the surrounding portion of the top semiconductor layer during the oxide etch step.

Figure 20:
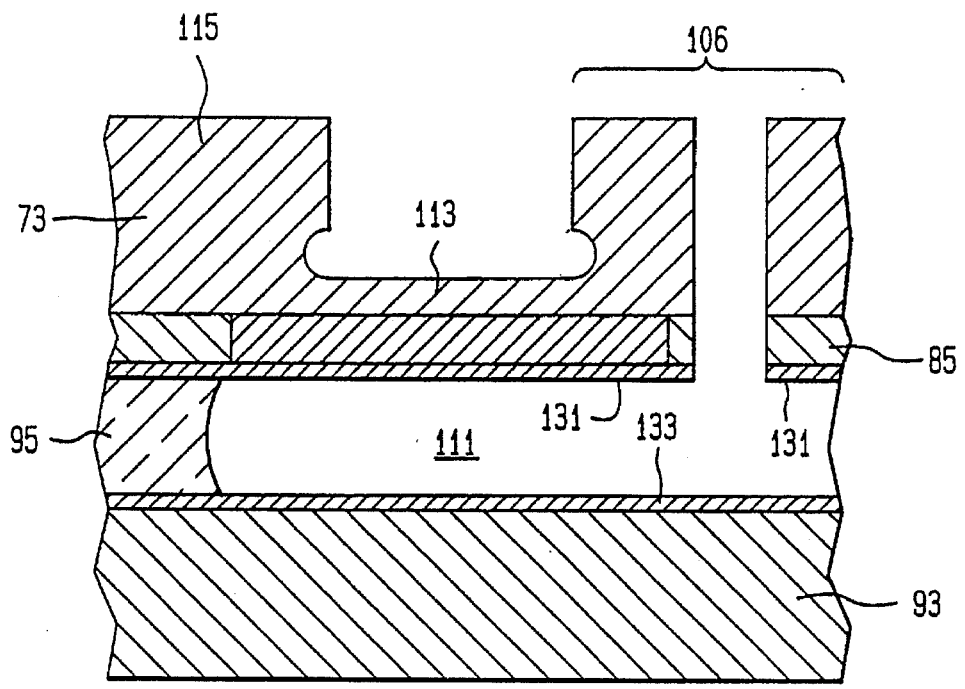
FIG. 20 shows a modification of the second embodiment of the invention to realize a piezoelectric structure defined by first and second conductive layers and a relatively large mass region supported in cantilever fashion by a plurality of arm regions to surrounding support material.

FIG. 20 shows a modification of the second embodiment of the invention, in which a first conductive layer 131 may be formed on epitaxial layer 85 and a second conductive layer 133 may be formed on handle wafer 93 prior to bonding the two together by means of thick oxide layer 95, thereby forming a piezoelectric structure defined by the first and second conductive layers 131, 133 and the relatively large mass region 106, supported in cantilever fashion by arm regions 113. During the etch process, first conductive layer 131 is sufficiently thin, so that it is readily punched at the etch apertures to permit etching out of cavity 111.

As will be appreciated from the foregoing description, the semiconductor accelerometer manufacturing process in accordance with the present invention effectively obviates the need to form a precursor 'flex-cavity' in an accelerometer handle wafer, while still providing a cavity that underlies the semiconductor accelerometer structure, so as to accommodate translation of the mass region and flexing of its support arm regions as necessary for proper accelerometer operation. Rather than wafer-bond a top accelerometer-containing layer that must be precisely aligned atop a cavity in the handle wafer by means of a relatively thin oxide layer, the process according to the invention attaches the top semiconductor layer to the handle wafer by means of a relatively thick insulator (oxide) layer. An accelerometer structure patterned in the top layer is then used as a mask to etch out a cavity in the underlying thick oxide, which lies atop a planar handle wafer. No alignment with a handle wafer cavity is required because there is no cavity in the handle wafer.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A process for manufacturing a semiconductor device comprising the steps of:
   (a) forming a buried insulator region beneath a first portion of a first surface of a semiconductor substrate;
   (b) forming a semiconductor layer on said first surface of said semiconductor substrate, so as to overlie said buried insulator region therebeneath;
   (c) attaching the structure formed in step (b) to a support substrate by way of an insulator layer such that said insulator layer lies between said semiconductor layer and said support substrate;
   (d) selectively forming an etch masking layer on said semiconductor substrate so as to define a patterned etch mask having a topology that exposes a first portion of said semiconductor substrate overlying said buried insulator region therebeneath and a second portion of said semiconductor substrate spaced-apart from said first portion thereof and overlying a portion of said substrate spaced-apart from said buried insulator region therein;
   (e) exposing the structure resulting from step (d) to a first etchant which etches the exposed first portion of said semiconductor substrate down to said buried insulator region, and etches the exposed second portion of said semiconductor substrate and said semiconductor layer therebeneath to said insulator layer; and
   (f) exposing the structure resulting from step (e) to a second etchant which etches said buried insulator region and said insulator layer, so as to leave a relatively large mass region of semiconductor material between said first and second portions of said semiconductor substrate supported by a reduced thickness portion of said semiconductor substrate and adjoining material of said semiconductor layer beneath the region of said semiconductor substrate from which said buried insulator region has been etched.

2. A process according to claim 1, wherein step (a) comprises:
   (a1) selectively forming an implant mask layer on a first surface of said semiconductor substrate so as to expose a first portion of said first surface of said semiconductor substrate;
   (a2) implanting material into a first buried region of said semiconductor substrate beneath said exposed first portion of said first surface thereof; and
   (a3) annealing the structure of step (a2) to form said buried insulator region.

3. A process according to claim 1, wherein step (b) comprises non-selectively forming a semiconductor layer on said first surface of said semiconductor substrate and introducing conductivity type determining impurities into that portion of said semiconductor layer overlying said buried insulator region.

4. A process according to claim 1, wherein step (c) comprises forming a first conductive layer on said semiconductor layer, forming a second conductive layer on said support substrate, and attaching said first and second conductive layers to opposite sides of an insulator layer, and wherein step (e) includes etching through said first insulator layer exposed by said etch masking layer, thereby forming a piezoelectric structure defined by said first and second conductive layers and the cantilevered relatively large mass region of semiconductor material.

5. A process for manufacturing a semiconductor device comprising the steps of:
   (a) forming a plurality of spaced-apart insulator finger regions buried beneath respective ones of plural first narrow portions of a first surface of a semiconductor substrate, said plural first portions of said first surface of said substrate extending from a second portion of said first surface of semiconductor substrate to a surrounding, spaced-apart, third portion of said first surface of semiconductor substrate, said second portion of said first surface of semiconductor substrate having a lateral dimension larger than those of said first, narrow portions of said first surface of said semiconductor substrate;
   (b) forming a semiconductor layer on said first surface of said semiconductor substrate, so as to overlie said insulator finger regions therebeneath;
   (c) attaching the structure formed in step (b) to a support substrate by way of an insulator layer such that said insulator layer lies between said semiconductor layer and said support substrate;
   (d) selectively forming an etch masking layer on said semiconductor substrate so as to define a patterned etch mask having a topology that exposes plural first narrow portions of a second surface of said semiconductor substrate overlying respective ones of said plurality of spaced-apart insulator finger regions therebeneath and a second portion of said second surface of said semiconductor substrate overlying said second portion of said first surface of said semiconductor substrate;

(e) exposing the structure resulting from step (d) to a first etchant which etches the exposed plural first narrow portions of said second surface of said semiconductor substrate down to said plurality of spaced-apart insulator finger regions, and etches the exposed second portion of said second surface of said semiconductor substrate and said semiconductor layer therebeneath to said insulator layer; and (f) exposing the structure resulting from step (e) to a second etchant which etches said plurality of spaced-apart insulator finger regions and said insulator layer, so as to leave a relatively large mass region of semiconductor material between said second and third portions of said first semiconductor substrate supported by a plurality of reduced thickness portions of said semiconductor substrate and adjoining material of said semiconductor layer beneath respective ones of said plurality of narrow regions of said semiconductor substrate from which said buried insulator finger regions have been etched.

6. A process according to claim 5, wherein step (b) comprises non-selectively forming a semiconductor layer on said first surface of said semiconductor substrate and introducing conductivity-type determining impurities into portions of said semiconductor layer overlying said insulator finger regions.

7. A process according to claim 5, wherein step (c) comprises forming a first conductive layer on said semiconductor layer, forming a second conductive layer on said support substrate, and attaching said first and second conductive layers to opposite sides of an insulator layer, and wherein step (e) includes etching through said first insulator layer exposed by said etch masking layer, thereby forming a piezoelectric structure defined by said first and second conductive layers and the cantilevered relatively large mass region of semiconductor material.

8. A process for manufacturing a semiconductor device comprising the steps of:

(a) forming a buried insulator region beneath a first portion of a first surface of a semiconductor substrate;

(b) attaching said semiconductor substrate to a support substrate by way of an insulator layer such that said insulator layer lies between said semiconductor substrate and said support substrate;

(c) selectively forming an etch masking layer on said semiconductor substrate so as to define a patterned etch mask having a topology that exposes a first portion of said semiconductor substrate overlying said buried insulator region therebeneath and a second portion of said semiconductor substrate spaced-apart from said first portion thereof and overlying a portion of said substrate spaced-apart from said buried insulator region therein;

(d) exposing the structure resulting from step (c) to a first etchant which etches the exposed first portion of said semiconductor substrate down to said buried insulator region, and etches the exposed second portion of said semiconductor substrate to said insulator layer; and (e) exposing the structure resulting from step (d) to a second etchant which etches said buried insulator region and said insulator layer, so as to leave a relatively large mass region of semiconductor material between said first and second portions of said semiconductor substrate supported by a reduced thickness portion of said semiconductor substrate beneath that region of said semiconductor substrate from which said buried insulator region has been etched.

9. A process according to claim 8, wherein step (b) comprises forming a first conductive layer on said semiconductor substrate, forming a second conductive layer on said support substrate, and attaching said first and second conductive layers to opposite sides of an insulator layer, and wherein step (d) includes etching through said first insulator layer exposed by said etch masking layer, thereby forming a piezoelectric structure defined by said first and second conductive layers and the cantilevered relatively large mass region of semiconductor material.

10. A process for manufacturing a semiconductor device comprising the steps of:

(a) forming a plurality of spaced-apart insulator finger regions buried beneath respective ones of a plural first narrow portions of a first surface of a semiconductor substrate, said plural first portions of said first surface of said substrate extending from a second portion of said first surface of semiconductor substrate to a surrounding, spaced-apart, third portion of said first surface of semiconductor substrate, said second portion of said first surface of semiconductor substrate having a lateral dimension larger than those of said first, narrow portions of said first surface of said semiconductor substrate;

(b) attaching the structure formed in step (a) to a support substrate by way of an insulator layer such that said insulator layer lies between said semiconductor substrate and said support substrate;

(c) selectively forming an etch masking layer on said semiconductor substrate so as to define a patterned etch mask having a topology that exposes said plural first narrow portions of a second surface of said semiconductor substrate overlying respective ones of said plurality of spaced-apart insulator finger regions therebeneath and a second portion of said second surface of said semiconductor substrate overlying said second portion of said first surface of said semiconductor substrate;

(d) exposing the structure resulting from step (c) to a first etchant which etches the exposed plural first narrow portions of said second surface of said semiconductor substrate down to said plurality of spaced-apart insulator finger regions, and etches the exposed second portion of said second surface of said semiconductor substrate to said insulator layer; and (e) exposing the structure resulting from step (d) to a second etchant which etches said plurality of spaced-apart insulator finger regions and said insulator layer, so as to leave a relatively large mass region of semiconductor material between said second and third portions of said semiconductor substrate supported by a plurality of reduced thickness portions of said semiconductor substrate beneath respective ones of said plurality of narrow regions of said semiconductor substrate from which said buried insulator finger regions have been etched.

11. A process according to claim 10, wherein step (a) comprises forming a first conductive layer on said semiconductor substrate, and step (b) comprises forming a second conductive layer on said support substrate and attaching said first and second conductive layers to opposite sides of an insulator layer, and wherein step (d) includes etching through said first insulator layer, and underlying material of said first conductive layer, exposed by said etch masking layer.

* * * * *